United States Patent [19]

Shepard

[11] Patent Number: 5,574,294
[45] Date of Patent: Nov. 12, 1996

[54] VERTICAL DUAL GATE THIN FILM TRANSISTOR WITH SELF-ALIGNED GATES / OFFSET DRAIN

[75] Inventor: Joseph F. Shepard, Hopewell Junction, N.Y.

[73] Assignee: International Business Machines Corporation, Armonk, N.Y.

[21] Appl. No.: 576,103

[22] Filed: Dec. 22, 1995

[51] Int. Cl.⁶ .......................... H01L 29/76; H01L 21/265
[52] U.S. Cl. ............................. 257/66; 257/49; 257/327; 257/328; 257/329; 257/335; 257/336; 257/344; 257/377; 257/412; 257/618; 437/40; 437/43; 437/46; 437/109; 437/191; 437/233; 437/235
[58] Field of Search ........................................ 257/327, 328, 257/329, 335, 336, 344, 377, 412, 618, 49, 66; 437/40, 43, 46, 109, 191, 233, 235

[56] References Cited

U.S. PATENT DOCUMENTS

| | | | |
|---|---|---|---|
| 4,924,279 | 5/1990 | Shimbe | 257/327 |
| 5,001,540 | 3/1991 | Ishihara | 357/23.4 |
| 5,108,938 | 4/1992 | Solomon | 437/41 |
| 5,160,491 | 11/1992 | Mori | 437/40 |

OTHER PUBLICATIONS

T. Hashimoto, et al., "Thin Film Effects of Double–Gate Polysilicon MOSFET" Extended Abstracts of the 22nd (1990 International) Conference on Solid State Devices and Materials, Scandai, pp. 393–396, 1990.

K. Itahashi, et al., "A Split Wordline Cell for 16Mb SRAM Using Polysilicon Sidewall Contacts" IEEE. IEDM 91–477, pp. 17.4.1–17.4.4, 1991.

C. T. Liu, et al., "High Reliability and High Performance 0.35um Gate Inverted TFT's for 16Mbit SRAM Applications Using Self–Aligned LDD Structures" AT&T Bell Labs, IEEE, IEDM 92–823, pp. 32.7.1–32.7.4, 1992.

*Primary Examiner*—Edward Wojciechowicz
*Attorney, Agent, or Firm*—Kris V. Srikrishnan

[57] ABSTRACT

A process for making a dual gated thin film transistor (TFT), having a sidewall channel and self-aligned gates and off-set drain is disclosed. A substrate having a top surface with insulating regions is provided. A bilayer having a polysilicon bottom layer and an insulating top layer, is patterned to form the bottom electrode of the TFT with an insulating layer over it. A first gate insulator is formed in contact with sides of the bottom electrode. A layer of second polysilicon having two end source and drain regions and a middle channel region is formed with the channel region being vertical along the side of the bottom electrode and overlying insulator layer and in contact with the first gate insulator. A second gate insulator is formed on the second polysilicon. A contact opening is etched in the insulating layers overlying the bottom electrode, in a region away from the second polysilicon to expose surface of part of the bottom electrode. A third polysilicon layer is deposited and patterned to have a horizontal region overlapping the contact opening to make contact to the bottom electrode, and to have sidewall electrode regions in contact with the second gate insulator and superadjacent to the channel region act as the top electrode of the TFT. The sidewall spacer electrode regions are connected to the horizontal regions of the third polysilicon. Thus the top and bottom electrode are also electrically connected together. The source and drain regions are doped selectively. By choice of implant conditions, the off-set region having a desired dopant concentration different from the device layer concentration, can be formed at the drain side of the dual gated TFT.

19 Claims, 3 Drawing Sheets

VERTICAL DUAL GATE THIN FILM TRANSISTOR WITH SELF-ALIGNED GATES / OFFSET DRAIN

FIELD OF INVENTION

The present invention relates generally to a semiconductor process for fabricating a thin film transistor device (TFT) and in particular relates to an improved process for defining a dual gate thin film transistor.

BACKGROUND OF THE INVENTION

Thin film transistors are field effect transistors (FETs) that offer major cost and density advantages. However, TFTs have some inferior characteristics such as lower gains and off-state leakage currents. Unlike the conventional FETs where the source, drain and channel regions are formed in the body of a single crystal substrate, the device regions of a TFT are formed in a polysilicon or an amorphous silicon layer (device layer) overlying a substrate. Since the polysilicon layer is formed at relatively lower temperatures and need not be within the body of the single crystal substrate, the device regions can be formed above the substrate to form stacked transistors, which provide greater density and lower cost. However, the polysilicon channels provide for smaller on-currents compared to monocrystalline silicon channels. The TFTs are most commonly used in flat panel displays as switching transistors and in Static Random Access Memories (SRAM) as load devices.

A structural invention known as double-gated polysilicon TFT has been found to provide increased on-current, twice as much as the on-current from a single gated device. Hashimoto et al., (in "Thin Film Effects of Double-Gate polysilicon MOSFET", Extended Abstracts of the 22nd conference on Solid State Devices and Materials, Sendai, 1990, ppp 393–396), describe a double gated TFT device, wherein the channel body polysilicon layer is sandwiched between a top and a bottom electrode. The top and bottom gate electrodes of the device described in Hashimoto et al, is shown in FIG. 1, and appear to be patterned using separate lithographic process steps. Hashimoto's study further showed that by using a thinner polysilicon channel in combination with the two gates, the on-current can be increased by one to two orders of magnitude. K. Itabashi et al. also describe the use of a double-gated PMOS thin film transistor load device in a 16 Mb SRAM, in their paper titled, "A Split Wordline Cell For 16 Mb SRAM Using Polysilicon Sidewall Contacts", IEDM pp 477–480, 1991. The Itabashi's SRAM cell was built using 5 polysilicon levels (figure not shown in here), the lowermost polysilicon is the gate electrode of the MOS transistor, polysilicon layers 2, 3 and 4 defined the dual gated TFT transistor and the topmost polysilicon layer is the ground plane. Itabashi's process involves the etching of contact openings through polysilicon layers 2 and 3 and the intervening insulators, such that when polysilicon layer 4 is deposited and patterned, it makes sidewall contact to electrodes 2 and 3 (in separate locations). Thus, the bottom and top gates of the TFT are connected together and the TFT channel layer and the MOS gate electrode are connected together. In both of these prior art methods, the process involves patterning bottom and top gates in separate steps which increase the process complexity.

Another desired feature in TFTs is drain off-sets, which are lightly doped body silicon parts outside of the gate electrode/channel region, somewhat similar to lightly doped drains (LDDs) in FETs. Liu et al. ("High Reliability, high Performance 0.35 um Gate Inverted TFT for 16 Mbit SRAM Applications Using Self-Aligned LDD Structures", 1992 IEDM 823–826) describe forming LDD type spacer regions in a bottom gate TFT using sacrificial sidewall spacers. Drain off-sets reduce punch-thru problems and off-state leakage current.

Mori (U.S. Pat. No. 5,160,491) teaches forming a field effect transistor on the sidewalls of a trench. In Mori's device, the source, channel and drain are vertically disposed adjacent to a trench and the gate insulator and electrode are formed on the sidewall of the trench. The vertically formed FET is claimed to provide higher density. Shimbo (U.S. Pat. No. 4,924,279) describes a thin film transistor device somewhat similar to Mori's in its structure. In Shimbo's process, a vertical step is formed by a sandwich of layers; a source layer, an insulating spacer and a drain layer. Along the sidewall of this sandwich, a channel, gate insulator and gate electrode are deposited sequentially. This structure has been claimed to provide a short channel length (the thickness of the insulator spacer) and further the channel region is shielded from light radiation which is especially of benefit in TFT display devices using liquid crystal devices. Whereas, Shimbo's process is interesting, it does not provide a bottom gate TFT. Further, the location of source and drain in the Shimbo device configuration would require additional process steps to connect them to other device parts.

Ishihara (U.S. Pat. No. 5,001,540) forms a gate stack and deposits a TFT device polysilicon layer going over the side of the gate stack. A sidewall insulator is used to protect the vertical part of the device layer, while the horizontal unprotected parts are implanted to define the source and drain extensions. The width of the sidewall spacer determines the off-set region length in the Ishihara's process. Further, Ishihara's method fails to teach a process for forming of a dual gated TFT. In Ishihara's device the off-set region is simply the extension of the channel layer with the same dopant concentration as the channel layer. There is no flexibility to adjust the off-set region dopant concentration to optimize the resistivity of the off-set regions. The resistance may be too high for applications requiring faster switching speed and larger "on" current.

Thus, there is a clear need in TFT manufacturing for a simplified and high yielding process for forming dual-gated TFTs, that is self -aligning, allows for the formation of off-set regions of selected resistivity and involves fewer, easily controllable manufacturing steps.

OBJECTS OF THE INVENTION

An object of the present invention is to provide a manufacturing process for a dual gated TFT with improved yield and reliability.

Another object of the present invention is to provide a self-aligned process for forming the source and drain regions in a dual gated TFT and further allows for the formation of off-set regions with a preselected dopant concentration.

A further object of the present invention is to provide for simultaneous impurity doping of the source and drain regions of a TFT and simultaneous connection of top and bottom gate electrodes without additional depositions.

A still further object of the present invention is to provide a low cost manufacturing process, usable on large substrates and can provide a small cell size.

SUMMARY OF THE INVENTION

A process for making a dual gated thin film transistor (TFT), having a sidewall channel, self-aligned gates and off-set drain is disclosed. A substrate having a surface with insulating regions is provided. A bilayer having a polysilicon bottom layer and an insulating top layer, is patterned to form the bottom electrode of the TFT with an insulating layer over it. A first gate insulator is formed in contact with sides of the bottom electrode. A layer of second polysilicon having two end source and drain regions and a middle channel region is formed with the channel region being vertical along the side of the bottom electrode and overlying insulator layer and in contact with the first gate insulator. A second gate insulator is formed on the second polysilicon. A contact opening is etched in the insulating layers overlying the bottom electrode, in a region away from the second polysilicon to expose surface of part of the bottom electrode. A third polysilicon layer is deposited and patterned to have a horizontal region overlapping the contact opening to make contact to the bottom electrode, and to have sidewall electrode regions in contact with the second gate insulator and superadjacent to the channel region act as the top electrode of the TFT. The sidewall spacer electrode regions are connected to the horizontal regions of the third polysilicon. Thus the top and bottom electrode are also electrically connected together. The source and drain regions are doped selectively. By choice of implant conditions, the off-set region having a desired dopant concentration different from the device layer concentration, can be formed at the drain side of the dual gated TFT.

BRIEF DESCRIPTION OF THE DRAWINGS

The objects, features and advantages of the present invention will be apparent from the following more particular description of the invention illustrated in the accompanying drawings, in which.

DETAILED DESCRIPTION OF THE INVENTION

The present invention overcomes many of the process difficulties associated with the prior art processes by the formation of the sidewall TFT channel, in a self aligned manner and without use of separate photomasks, along the sidewalls of a gate electrode. Further, the top and bottom gate electrodes are connected together by use of the top electrode layer in a novel manner. This and other aspects of the present invention is better understood by use of the FIGS. 2–7.

Figure 1:
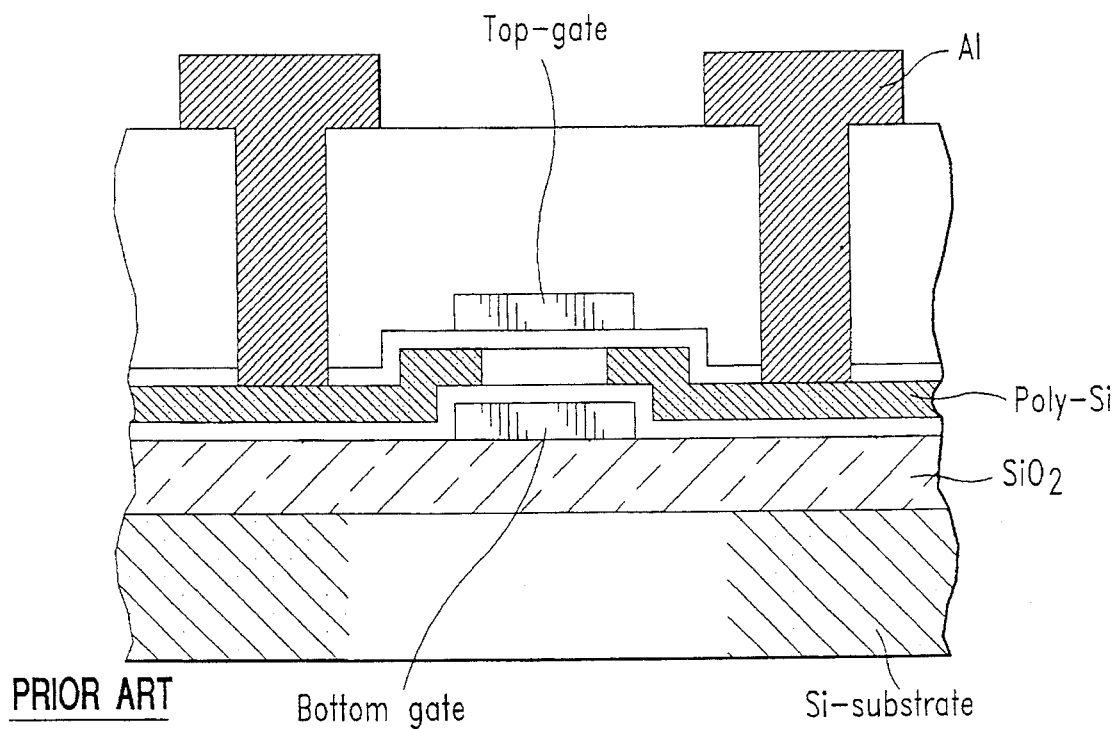
FIG. 1 is an illustration of a prior art dual gate structure.
Figure 2:
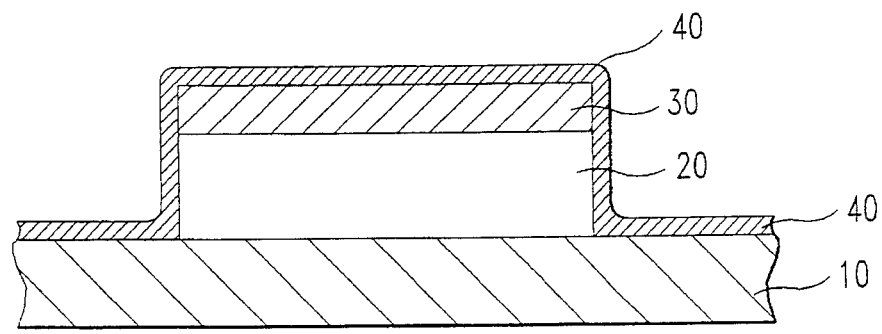
FIGS. 2 to 4 show cross-sections to illustrate a preferred embodiment of the present invention.

Referring to FIG. 2, a polysilicon gate electrode 20 with an overlying insulating layer 30 is patterned as a gate stack over an insulating layer 10 or a substrate with an insulating surface layer 10. The electrode 20 is the bottom gate electrode of the dual gated TFT of the present invention. The polysilicon is deposited preferably as a doped layer having an impurity concentration of $10^{19}$ to $10^{21}$/cc. The thickness of the electrode 20 is selected to be in the range of 1000 to 5000 Å, and preferably 3000 Å. The cap insulating layer 30 is preferably deposited by a low temperature chemical vapor deposition process such as plasma enhanced chemical vapor deposition (PECVD) and is deposited in the thickness range of 500 to 3000 Å, preferably about 1000 Å. In the preferred mode, the cap insulator layer is a silicon dioxide layer. The thickness of the composite layers of polysilicon and silicon dioxide determines, in large part, the channel layer of the completed device. Both the polysilicon layer 20 and the oxide layer 30, are etched using fluorine chemistry by an anisotropic plasma etch process using known lithographic processes. Referring again to FIG. 2, a first gate insulating layer 40 in the thickness range of 100 to 500 Å, but preferably 200 Å is deposited over the entire substrate, the insulating layer conformally covering layer 30 and the sidewalls of the gate electrode 20. The insulating layer 40 is preferably silicon dioxide, deposited by chemical vapor deposition using silane or tetra ethylorthosilicate (TEOS) as a precursor.

Figure 3:
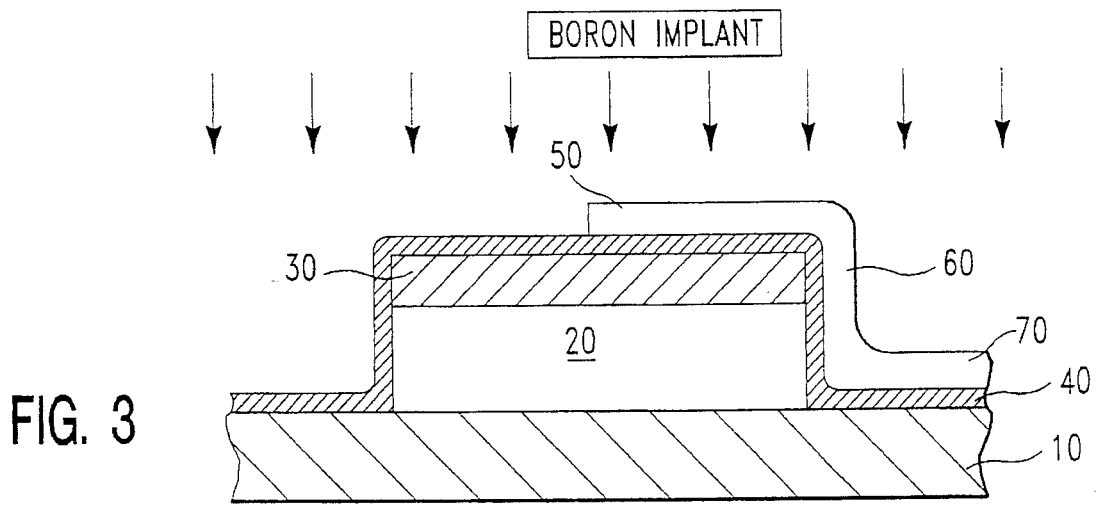

Now referring to FIG. 3, a layer of polysilicon or amorphous silicon is deposited and patterned as a TFT device layer, the device layer going over the step created by the gate electrode stack. The device TFT layer has two horizontal parts 50 and 70 and an in-between vertical part 60. By implantation, using for example boron, the regions 50 and 70 are doped to a concentration of $10^{17}$ to $10^{18}$, which is usually referred to as p-doping. The purpose of this will become clearer later as the device is completed. The energy of implantation is chosen to be shallow, and there is no appreciable implantation in the vertical part 60 of the TFT device layer since the implant angle is vertical.

Figure 4:
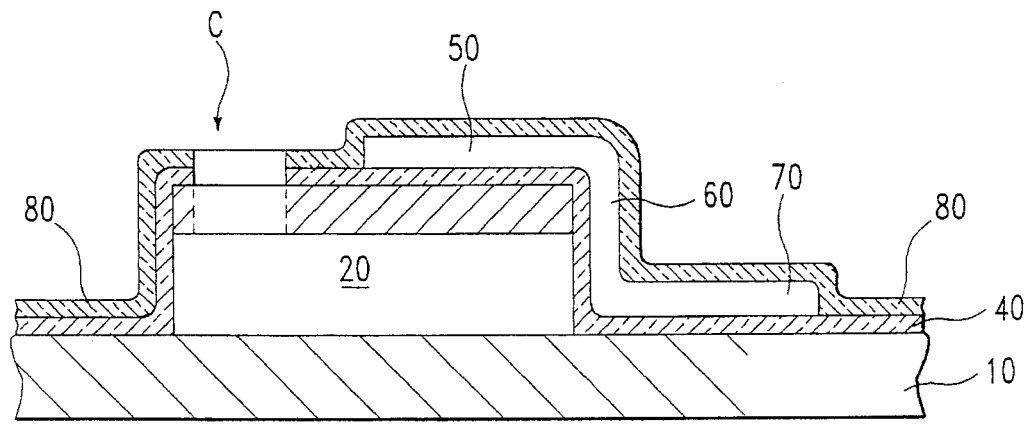

Now referring to FIG. 4, a blanket silicon dioxide layer 80 100 to 500 Å, but preferably 200 Å is deposited over the entire surface including the TFT polysilicon device layer with its horizontal and vertical parts, 50,60,70. The part of the insulating layer 80 overlying the TFT channel region 60 acts as the top gate insulator to control the conductivity of the vertical channel region 60. A contact hole is etched into layers 80 and 40 to expose an area of bottom gate electrode 20. The contact hole "c" is etched by a reactive ion etch process or etched using a dilute hydrofluoric acid. The etching process preferably uses a photoresist mask. The contact opening "c" can be located over any part of the bottom electrode that does not overlap the TFT device polysilicon layer. In a preferred process, a protective polysilicon layer may be deposited over layer 80, and remains in place subsequent to the contact hole etching (not shown in the cross-sections). The purpose of the protective layer is to shield the gate oxide layer 80 from being etched through "pin holes" in the resist and to keep fast ions such as sodium from contaminating the oxide layer 80. The protective polysilicon layer is incorporated in the top gate electrode formation, when a subsequent polysilicon layer is deposited.

Figure 5:
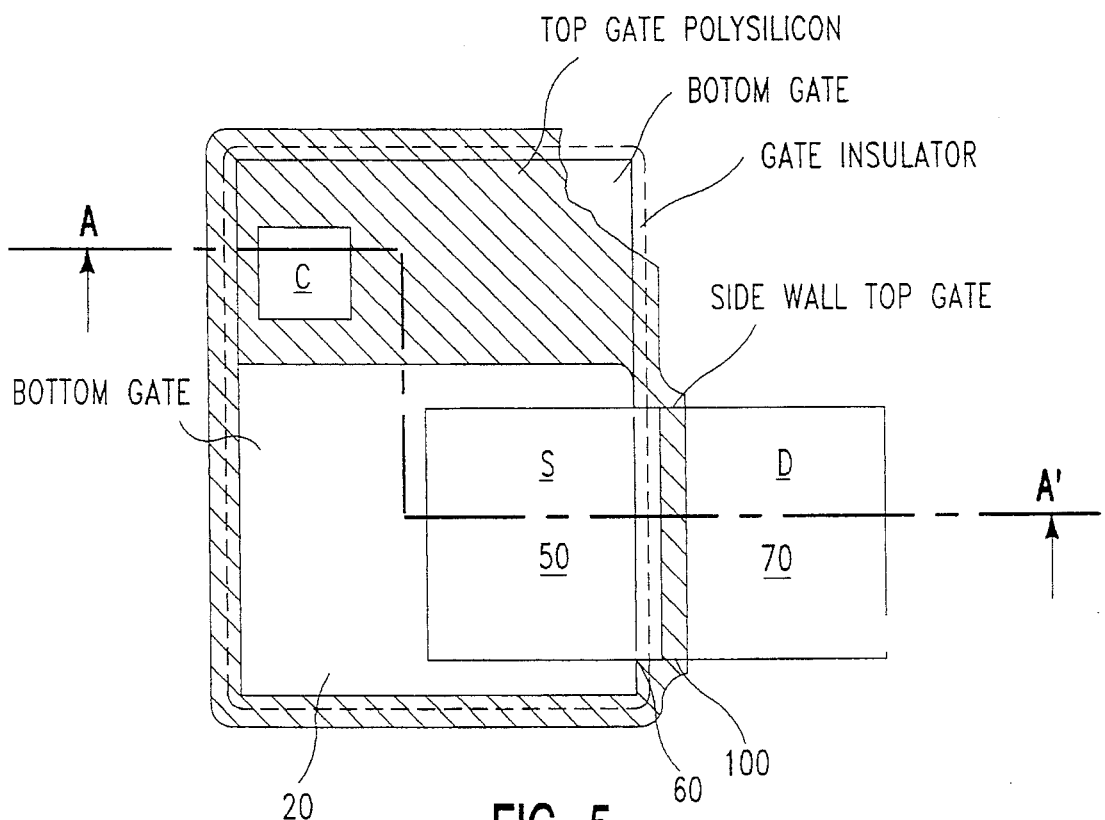
FIG. 5 is a top-view of the dual gated TFT illustrated in the present invention example.
Figure 6:
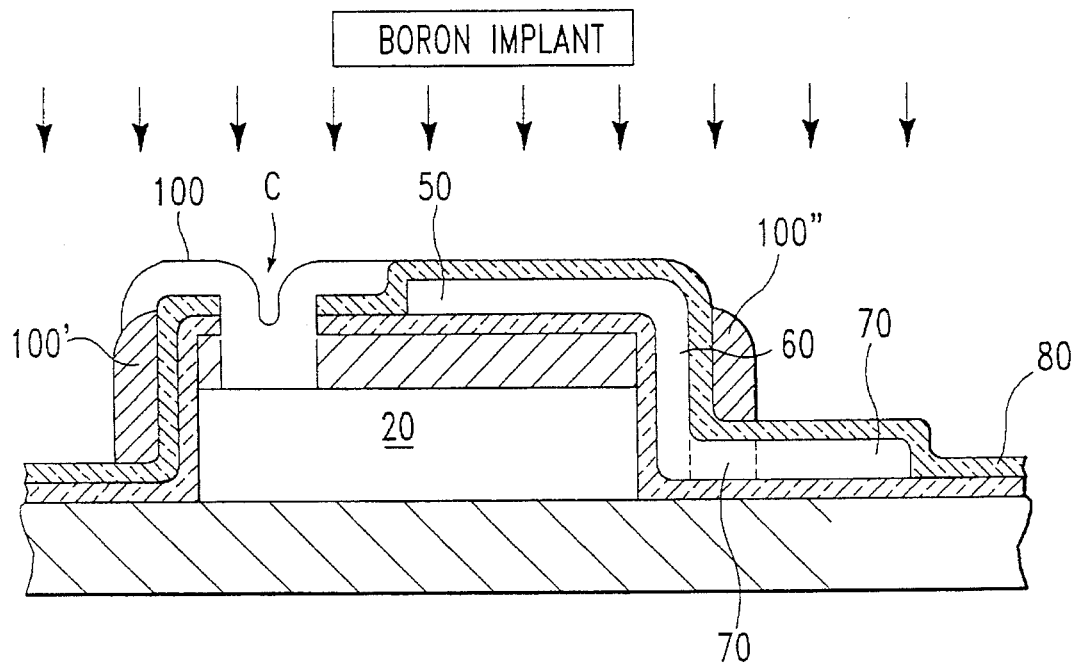
FIG. 6 is a cross-sectional view of the dual gated TFT corresponding to the top view of FIG. 5.

Referring now to FIG. 5, an example of a top view of the layout of the different parts of the TFT is shown. Conceivably many variations are possible. A third polysilicon electrode layer 100 is conformally deposited over the entire substrate and is removed by an anisotropic process from everywhere except over the contact opening "c", where it overlaps of the bottom gate electrode outside of the TFT device layer region 50. Thus, both the bottom and top gate electrodes are connected together electrically, without a need for additional layers or processes. The anisotropic process used results in also forming a sidewall of the polysilicon layer 100 along the edge of the bottom gate electrode 20 and over the channel region 60 of the device layer as shown in the FIG. 5. Further, the masking used to protect layer 100 over the contact opening "c" also is designed to provide a connection between the remaining horizontal part of the layer 100 and the sidewall spacer part 100' of layer 100. These process details are better understood by use of a cross-section of the device shown in FIG. 5 along a plane identified by A—A'. The cross section shown in FIG. 6, illustrates a polysilicon layer 100 making contact to layer 20 through the contact opening "c" and is in connected to the sidewall spacer regions 100' and 100". Region 100" is the top gate electrode of the TFT, which is also a part of the polysilicon layer 100. Layer 100 as deposited is preferably doped to a concentration of $10^{19}$ to $10^{21}$. Parts of region 50 and 70, not masked by the sidewall spacer 100", is implanted with boron (if fabricating a p-channel TFT) using shallow dopant energies again to a concentration of $10^{19}$ to $10^{21}$. Referring to FIG. 6, the implant process dopes the entire region 50 and 70 except for a part labelled as 70'. Region 70' was masked by the sidewall electrode 100" during the implantation. The region 70' has a dopant concentration p- from the first implantation and has a characteristic length determined by the thickness of the polysilicon top gate electrode 100". Region 70' is an off-set formed only in the drain side of the TFT, which reduces off-current, which is an improvement over processes that form off-set regions on both the source and drain sides. The off-set region allows use of higher fields to increase on-current without the concern of hot electrons or punch-thru. Even though boron was used as the dopant in the example, other impurities such as arsenic, antimony, phosphorus can be used. Where feasible, other dopant methods can be used such as diffusion in place of implantation.

Figure 7:
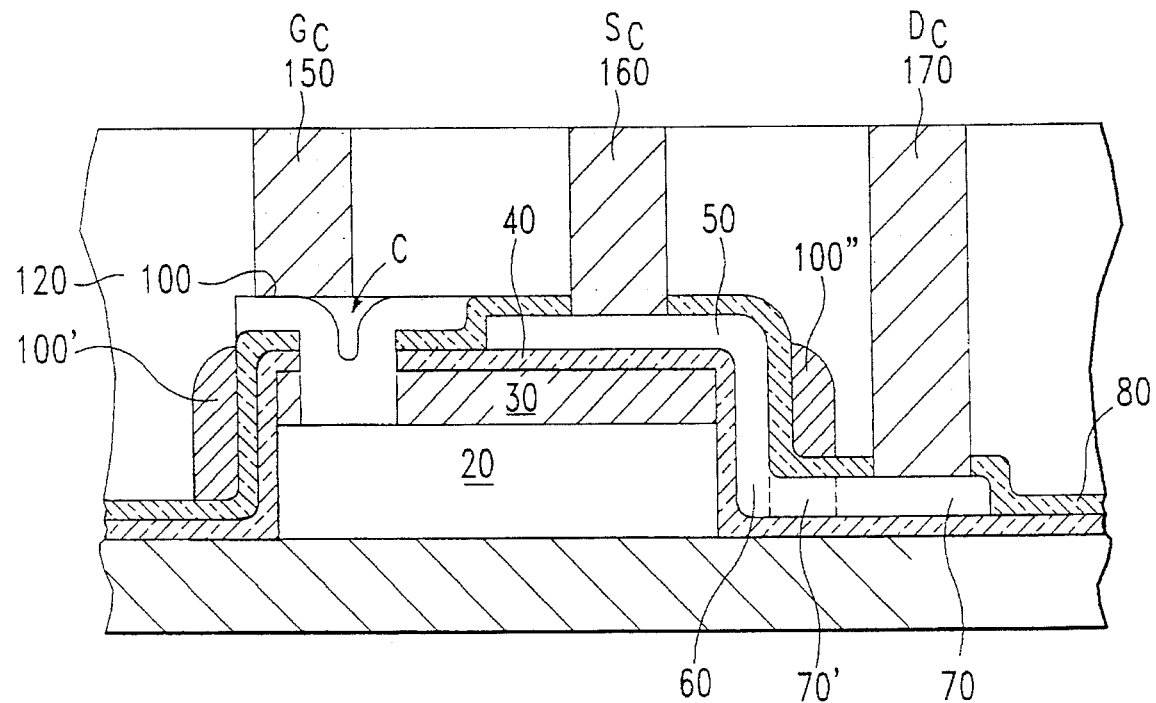
FIG. 7 is a cross-sectional view of a completed dual gated TFT device showing contacts to the source, drain and gate regions.

FIG. 7 shows the dual gated TFT structure, after the device of FIG. 6, has been passivated by a layer of insulator 120 which has been planarized. Contact openings Dc, Sc and Gc haven been etched into the insulator and metallized to make contact studs 150, 160, 170 respectively to the gate, source and drain regions. Alternative methods can be used to contact the device regions and to complete interconnection between adjacent devices or between the TFT and other devices on the substrate. While the invention has been described in terms of a single preferred embodiment, various alternatives and modifications can be devised by those skilled in the art without departing from the invention. Accordingly, the present invention is intended to embrace all such alternatives which fall within the scope of the appended claims.

What is claimed is:

1. A method of making a dual gated thin film transistor (TFT), having a bottom and a top electrode, and a sidewall channel, comprising the steps of:

providing a substrate;

patterning a bilayer consisting of a first polysilicon layer overlying said substrate, and an insulating layer overlying the first polysilicon, to form the bottom electrode of said TFT and an insulating layer thereon;

forming a first gate insulator over the sides of the bottom electrode;

patterning a layer of second polysilicon having a source and drain regions at the ends and a channel region therebetween, said channel region formed vertically along the side of the bottom electrode and the overlying insulator and in contact with said first gate insulator;

forming a second gate insulator on said second polysilicon;

forming a contact opening in said overlying insulating layer so as to expose surface of part of said bottom electrode;

depositing a layer of third polysilicon conformally over said second gate insulator, said third polysilicon in contact with said first polysilicon through said contact opening;

patterning said third polysilicon layer to form horizontal regions overlapping said contact opening and sidewall spacer electrode regions, said spacer regions in contact with the second gate insulator and adjacent to said channel region so as to act as the top electrode; and, doping said source and drain regions of said second polysilicon.

2. The method of claim 1 further comprises the step of implanting dopant impurities in a vertical direction after the step of patterning the second polysilicon, so as to dope the source and drain regions to a concentration in the range of $10^{17}$ to $10^{18}$/cc.

3. The method of claim 1 further comprises the step of depositing a protective layer of polysilicon in the thickness range of 100 Å to 500 Å over the second gate insulator after the step of forming the second gate insulator.

4. The method of claim 1, wherein the first polysilicon is characterized by an impurity concentration in the range of $10^{19}$ to $10^{21}$/cc.

5. The method of claim 1, wherein the second polysilicon is characterized by a dopant concentration in the range of $10^{15}$ to $10^{16}$/cc.

6. The method of claim 1, wherein the thickness of first polysilicon and third polysilicon is selected to be in the range of 1000 Å to 5000 Å.

7. The method of claim 1, wherein said first gate insulator and second gate insulator are preferably silicon dioxide.

8. The method of claim 7, wherein the silicon dixoide thickness is in the range of 100 Å to 500 Å.

9. The method of claim 1, where said step of forming a contact opening to expose the bottom gate surface, comprises the steps of:

forming a lithographic mask with opening correspond to the contact opening; and, etching the exposed insulating layers by a process selected from the group consisting of chemical wet etching, plasma etching and reactive ion etching.

10. The method of claim 1, wherein said third polysilicon is deposited in-situ doped with a dopant concentration in the range of $10^{19}$ to $10^{21}$/cc.

11. The method of claim 1, wherein said doping of the source and drain regions of the second polysilicon is carried out by vertical implantation, thereby forming a drain off-set region under the top gate spacer.

12. A vertical dual gated TFT device having a bottom and a top electrode, a sidewall channel and a drain off-set comprising:

a substrate;

a bilayer with a polysilicon bottom electrode overlying said substrate, and a co-extensive insulator on top of and in contact with the bottom electrode;

a first insulating gate layer overlying and in contact with side of the bottom electrode;

a polysilicon device layer, having a source and drain regions at the ends and a channel region therebetween, said channel region located vertically along the side of the bottom electrode and overlying insulator, and in contact with said first gate insulator, and one of said end regions located on top of the insulator overlying the bottom electrode;

a second insulating gate layer overlying said polysilicon device layer and in contact with the channel region;

a sidewall spacer polysilicon top electrode located in contact with the second gate insulator, adjacent to said channel region, said top electrode physically connected to a horizontal polysilicon part, which in turn connected to the bottom electrode through an opening in the insulator overlying the bottom electrode; and, an off-set region of the device layer underneath the top electrode located between the channel and drain regions of said device layer.

13. The device of claim 12, wherein said off-set region in said device layer is doped to a concentration in the range of $10^{17}$ to $10^{18}$/cc.

14. The device of claim 12, wherein the bottom electrode is doped to an impurity concentration in the range of $10^{19}$ to $10^{21}$/cc.

15. The device of claim 12, wherein the channel region of the device layer is doped to an impurity concentration in the range of $10^{15}$ to $10^{16}$/cc.

16. The device of claim 12, wherein the thicknesses of bottom electrode and top electrode are selected to be in the range of 1000 Å to 5000 Å.

17. The device of claim 12, wherein said first gate insulator and second gate insulator are silicon dioxide.

18. The device of claim 17, wherein the silicon dixoide has a thickness in the range of 100 Å to 500 Å.

19. The device of claim 12, wherein said source and drain regions of said device layer have dopant concentration in the range of $10^{19}$ to $10^{21}$/cc.

\* \* \* \* \*